United States Patent [19]
Qian et al.

[11] Patent Number: 5,918,132
[45] Date of Patent: Jun. 29, 1999

[54] METHOD FOR NARROW SPACE FORMATION AND SELF-ALIGNED CHANNEL IMPLANT

[75] Inventors: Qi-De Qian, Santa Clara; Peng Cheng, Campbell, both of Calif.

[73] Assignee: Intel Corporation, Santa Clara, Calif.

[21] Appl. No.: 08/775,722

[22] Filed: Dec. 31, 1996

[51] Int. Cl.[6] .................................................. H01L 21/336
[52] U.S. Cl. ....................... 438/299; 438/301; 438/197; 438/199; 438/585; 438/299
[58] Field of Search .................... 438/197, 199, 438/299, 301, 303, 585, 589, 595

[56] References Cited

U.S. PATENT DOCUMENTS

| | | | |
|---|---|---|---|
| 5,429,956 | 7/1995 | Shell et al. | 438/305 |
| 5,434,093 | 7/1995 | Chau et al. | 438/303 |
| 5,472,897 | 12/1995 | Hsu et al. | 438/303 |
| 5,489,543 | 2/1996 | Hong | 438/305 |
| 5,534,447 | 7/1996 | Hong | 438/305 |
| 5,538,913 | 7/1996 | Hong | 438/307 |

OTHER PUBLICATIONS

Fiegna et al, "Scaling the MOS Transistor Below 0.1 um: Methodology, Device Structures, and Technology Requirements", TED Jun. 1995, p. 941.

Kimura et al, "Short–Channel–Effect–Supressed Sub 0.1 um Grooved–Gate MOSFET's with W Gate", TED Jan. 1995, p. 94.

J. T. Jhorstmann et al, "Characterizatin of Sub–100 nm–MOS Transistors Fabricated by Optical Lithographer and a Sidewall–Etchback Process" NME, Sep. 1995.

Primary Examiner—Peter Toby Brown
Assistant Examiner—Khanh Duong
Attorney, Agent, or Firm—Blakely, Sokoloff, Taylor & Zafman LLP

[57] ABSTRACT

A method of forming a narrow space using a litho-less process is disclosed. A first mask is formed on a substrate, the first mask having an edge. A spacer is then formed adjacent to the edge. A second mask is subsequently formed adjacent to the spacer. The spacer is then removed.

24 Claims, 15 Drawing Sheets

METHOD FOR NARROW SPACE FORMATION AND SELF-ALIGNED CHANNEL IMPLANT

BACKGROUND OF THE INVENTION

1. Field of the Invention

The present invention pertains to the field of semiconductor processing. More particularly, this invention relates to the formation narrow spaces.

2. Background of the Related Art

Metal oxide semiconductor (MOS) technology is used to form a number of different types of devices including memory devices and microprocessors. The basic device structure forming the field effect transistor (FET) comprises an insulated gate electrically overlaying a channel region between a source and drain. The gate is an electrically conductive material separated a small distance from the underlying silicon substrate via a thin insulating layer usually made of silicon oxide. The source and drain are formed in the silicon substrate by introducing dopants in controlled amounts to make the source and drain n-type or p-type relative to the surrounding silicon. The dopants for the source and drain are inserted into the silicon using diffusion or ion implantation, both processes which require subjecting the substrate to high temperatures.

Early transistor structures were formed by first diffusing dopants into the source and drain regions and afterward forming the gate. The formation of the gate was done by depositing gate material and subsequently doing conventional photolithography patterning. Because of the need to ensure that the gate overlay the entire channel region and limitations in manufacturing tolerances, high volume manufacturing required a significant gate overlap into the source and drain to ensure that the gate adequately covered the entire channel region. For smaller device sizes the gate overlap led to significant parasitic capacitance between the gate and source region and the gate and drain region. A self-aligning manufacturing process was then developed whereby the gate itself would serve as a mask for forming the source and drain. The gate had to be formed first, so that the source and drain could be formed in alignment with the gate. A consequence of the self-aligned process was that the gate material had to be changed from metal to silicon because of the requirement that the gate withstand the high temperature processing for forming the source and drain.

In an effort to achieve smaller than 100 nm gate lengths, a process was developed whereby conventional photolithography is used to define edges onto which the dimensions of the future gate is established. This process is referred to as "litho-less". The litho-less process provides for greater critical dimension control and allows for the formation of very small devices, which in turn provides greater device performance. An example of this process is shown in FIGS. 1a–1k. FIG. 1a shows a silicon substrate 130. A layer of gate dielectric 120, comprising silicon oxide, is formed on the substrate 130. A layer of polycrystalline silicon (polysilicon) 110 is formed on the gate dielectric 120. In FIG.1b, a layer of sacrificial oxide 140 is shown formed on the layer of polysilicon 110. The layer of sacrificial oxide 140 is patterned using a first mask 145 shown in FIG. 1c. The resulting intermediate structure showing the patterned sacrificial oxide 142 is depicted in FIG. 1d. A layer of silicon nitride 150 is formed, as shown in FIG. 1e. FIG. 1f discloses that the silicon nitride 150 is etched to create spacer 151. The sacrificial oxide 142 is removed, leaving spacer 151, as depicted in FIG. 1g. FIG. 1h shows that the exposed portion of the polysilicon 110 is removed. FIG. 1i indicates that the nitride spacer 151 is removed, exposing the remaining polysilicon 112, thus forming the transistor gate. The remainder of the transistor structure is formed using standard CMOS process.

A problem with the above litho-less process for forming a transistor gate is that it does not allow for channel engineering, since the gate serves to mask the channel region. Channel engineering techniques such as implantation and raised source/drain structures provide reduced short channel effect, resulting in greater device performance and increased reliability. Thus, what is desired is a method for forming a transistor gate using a litho-less technique that allows for channel engineering.

The above litho-less process allows for the formation of sub-lithographic gate lengths. Sub-lithographic gate lengths are those gate lengths that are not achievable using conventional photolithographic techniques, due to standard photolithographic resolution limits. Conventional photolithographic resolution limits are also encountered in the patterning of small or narrow spaces. Narrow spaces are used in every semiconductor product for transistor device active are definition and isolation. Thus, a method of forming narrow spaces using a litho-less process is also desirable.

SUMMARY OF THE INVENTION

A method of forming a narrow space using a litho-less process is disclosed. A first mask is formed on a substrate, the first mask having an edge. A spacer is then formed adjacent to the edge. A second mask is subsequently formed adjacent to the spacer. The spacer is then removed.

DETAILED DESCRIPTION

A method for narrow space formation and self-aligned channel implant is disclosed. In the following description, for the purposes of explanation, specific details are set forth to provide a thorough understanding of the present invention. However, it will be obvious to one skilled in the art that these specific details are not required to practice the present invention. In other instances, well known structures and processes are not described in particular detail in order to avoid obscuring the present invention.

The present invention solves the problem of overcoming the resolution limits of conventional photolithography when patterning small or narrow spaces in semiconductor devices. Narrow spaces are encountered in semiconductor products for transistor active area definition and isolation. In the present invention, a litho-less process is used to create a small or narrow space. Because the inherent control of the litho-less process is at least one order of magnitude better than the conventional lithographic process, the spaces created in accordance with the teachings of the present invention can be of much higher precision that the ones created by a conventional photolithographic process. The narrow spaces created in accordance with the teachings of the present invention are preferably smaller than 1500 Å in width, although larger sizes are possible.

The present invention also provides for the formation of sub-lithographic transistor gates while allowing for channel engineering. Channel engineering is not possible using the related art litho-less process. Channel engineering techniques such as implantation and channel recess can be used with the present invention to reduce short channel effects, which results in a more reliable transistor. Further, the present invention ensures that the channel engineering implant is localized and the junction capacitance need not be traded off for short channel performance, resulting in a better performing transistor.

In general, and in accordance with an embodiment of the present invention, a first mask is formed on a substrate. The first mask has an edge. A spacer is formed adjacent to the edge, and a second mask is formed adjacent to the spacer. The spacer is then removed, leaving a narrow space.

Figure 1A:
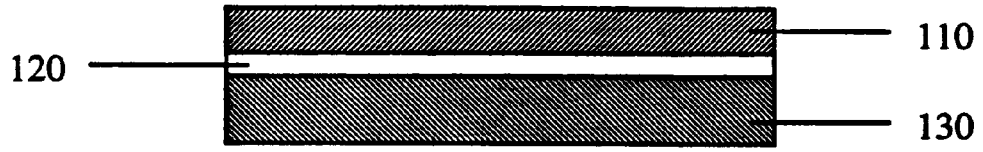
FIG. 1a is a side-view depiction of a silicon substrate, gate oxide, and polysilicon layer implemented in accordance with the related art.
Figure 1B:
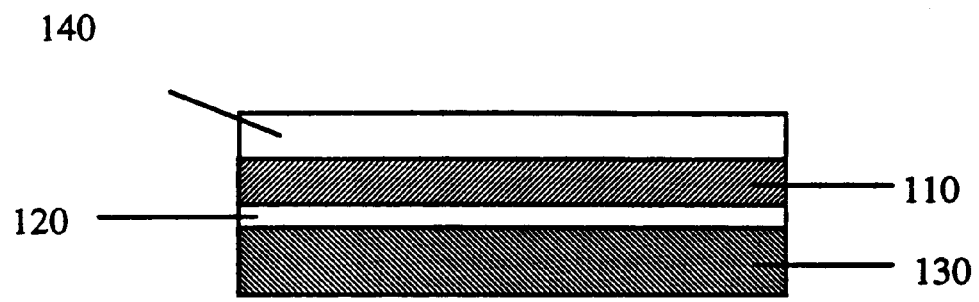
FIG. 1b is a side-view depiction of a layer of silicon oxide formed on the polysilicon layer in accordance with the teachings of the related art.
Figure 1C:
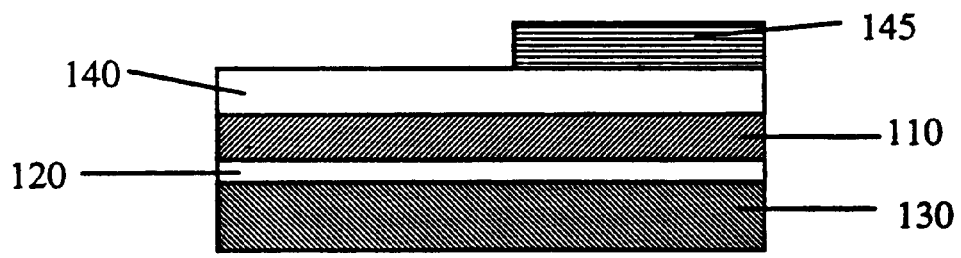
FIG. 1c is a side-view depiction of a photoresist mask formed on the layer of silicon oxide in accordance with the teachings of the related art.
Figure 1D:
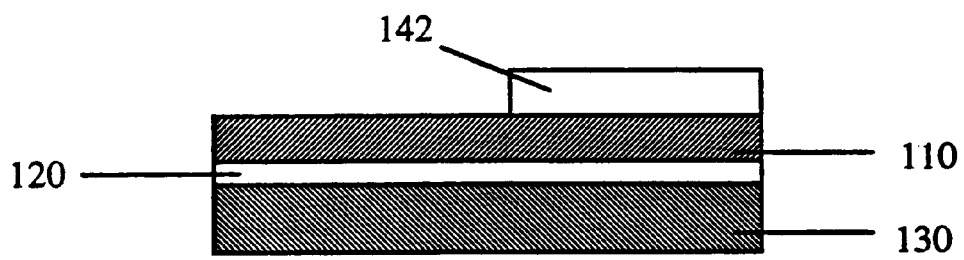
FIG. 1d is a side-view depiction of the patterned silicon oxide on the polysilicon layer implemented in accordance with the related art.
Figure 1E:
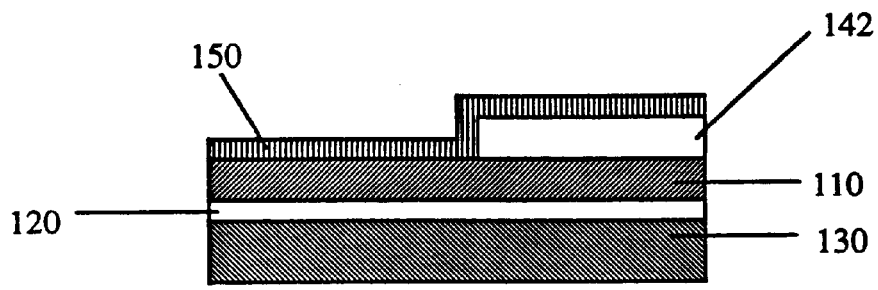
FIG. 1e is a side-view depiction of a layer of silicon nitride conformally deposited over the previously existing Structures in accordance with the teachings of the related art.
Figure 1F:
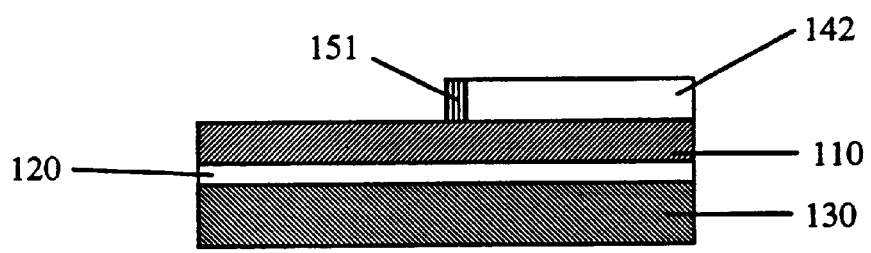
FIG. 1f is a side-view depiction of the silicon nitride layer having been anisotropically etched in accordance with the teachings of the related art.
Figure 1G:
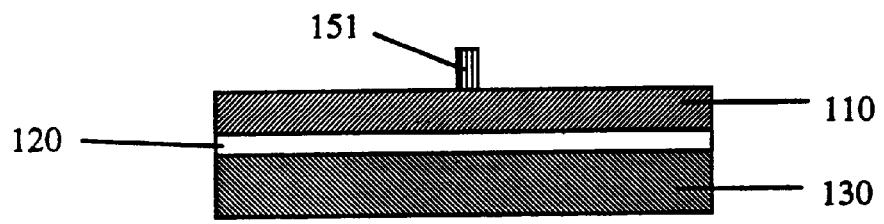
FIG. 1g is a side-view depiction of the silicon oxide having been removed in accordance with the teachings of the related art.
Figure 1H:
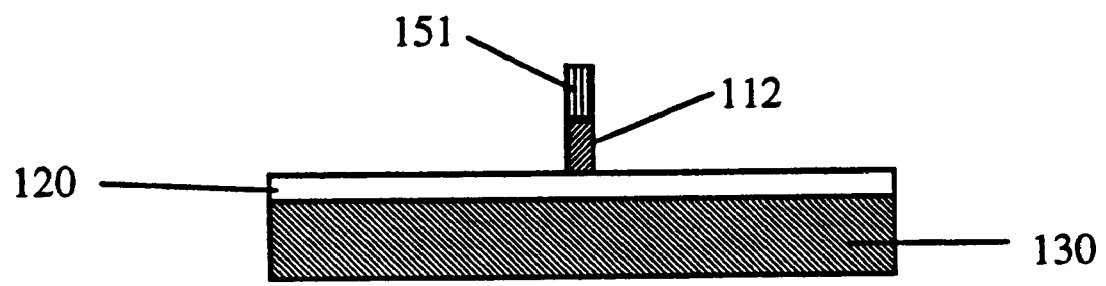
FIG. 1h is a side-view depiction of the polysilicon having been etched in accordance with the teachings of the related art.
Figure 1I:
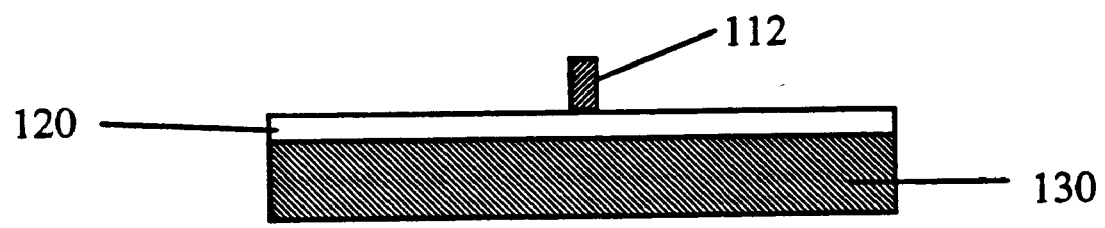
FIG. 1i is a side-view depiction of the gate structure implemented in accordance with the teachings of the related art.
Figure 2A:
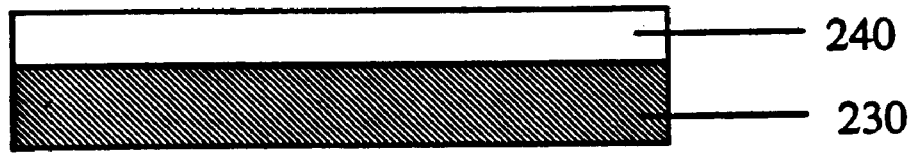
FIG. 2a is a side-view depiction of a substrate and a layer of first mask material implemented in accordance with the teachings of the present invention.

FIGS. 2a–2g depict a method of fabricating a narrow space implemented in accordance with the teachings of the present invention. FIG. 2a shows a side view of a layer of first mask material 240 formed on a substrate 230. The preferred first mask material in this example is silicon dioxide, formed by blanket deposition to a thickness of preferably 1800 angstroms (Å), although other thicknesses are possible. Materials other than silicon dioxide may also be used as the first mask material, including silicon nitride. The mask material can be any material that can withstand high temperature processing and can be etched. The substrate in the present example comprises silicon. Silicon formed on other substrates such as silicon oxide, aluminum oxide, or glass, on which integrated circuits can be built, can also be used.

Figure 2B:
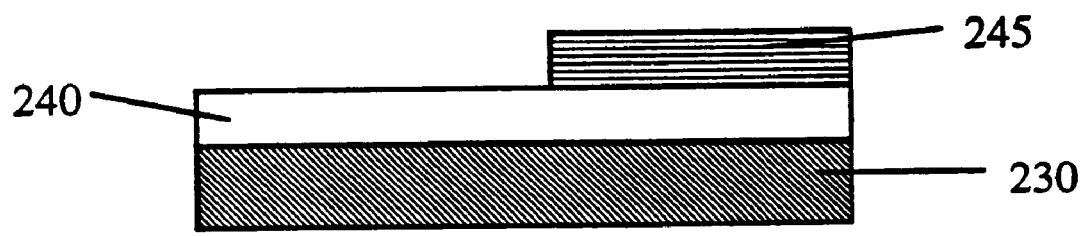
FIG. 2b is a side-view depiction of a photoresist mask formed on the layer of first mask material in accordance with the teachings of the present invention.
Figure 2C:
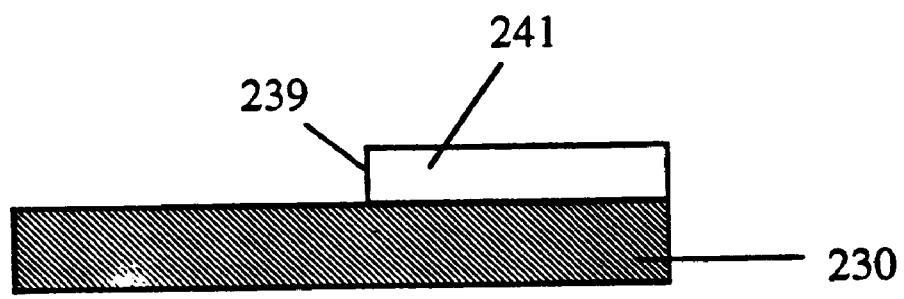
FIG. 2c is a side-view depiction of the first mask material having been patterned to form a first mask in accordance with the teachings of the present invention.

The first mask material 240 is typically patterned using a known photoresist lithography and plasma etching process. FIG. 2b shows a photoresist mask 245. The photoresist mask is used to form a first hard mask 241 from the first mask material 240, as depicted in FIG. 2c. It is adjacent to the edge 239 of the hard mask that the narrow space will be formed, as discussed below. Therefore, it is the patterning of the first hard mask material 240 that will determine the location of the narrow space.

Figure 2D:
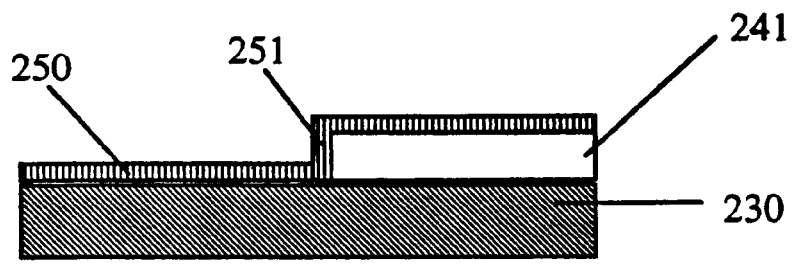
FIG. 2d is a side-view depiction of a layer of spacer material formed over the substrate and first mask in accordance with the teachings of the present invention.
Figure 2E:
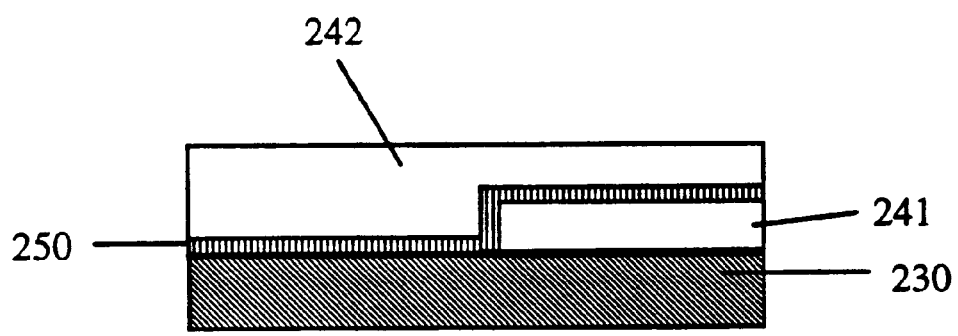
FIG. 2e is a side-view depiction of a layer of second mask material formed over the layer of spacer material in accordance with the teachings of the present invention.

Next, a layer of spacer material 250 is formed, as shown in FIG. 2d. The spacer material 250 is selected to be one that call withstand high temperature processing and can be etched. Further, the spacer material 250 must be one that allows selective etching of the spacer material 250 without also significantly etching the first hard mask 241 or the second hard mask 243, discussed below and shown in FIG. 2f. The preferred spacer material in this example is silicon nitride. The silicon nitride 250 is blanket deposited, preferably using chemical vapor deposition. The silicon nitride is deposited conformably so that the deposited silicon nitride 250 follows the shape of the first hard mask 241. Further, the conformal deposition ensures that the thickness of the spacer material 250 will be uniform over the horizontal and vertical surfaces. The vertical portion 251 of spacer material 250 adjacent to the first hard mask 241 edge will become a spacer, as described below. The thickness of the deposited silicon nitride 250, and thus the spacer 251, will determine the dimension of the future narrow space structure. Preferably, the thickness of the deposited silicon nitride 250 is 1000 Å or more. Smaller thicknesses are also possible.

After the deposition of the spacer material 250, a layer of second hard mask material 242 is formed over the layer of spacer material 250. The preferred second hard mask material 242 in this example is silicon dioxide, formed by blanket deposition to a thickness of 1800 Å. Other thicknesses are also possible. Other materials can also be used, including silicon nitride. The same considerations for selecting the first hard mask material 240 apply with respect to the second hard mask material 242. That is, the second hard mask material 242 must be one that can withstand high temperature processing and can be selectively etched without also etching the spacer material 250. It is preferred that the second mask material 242 be selected to be the same as the first mask material 240 so that the first and second hard masks can be later removed in a single step.

Figure 2F:
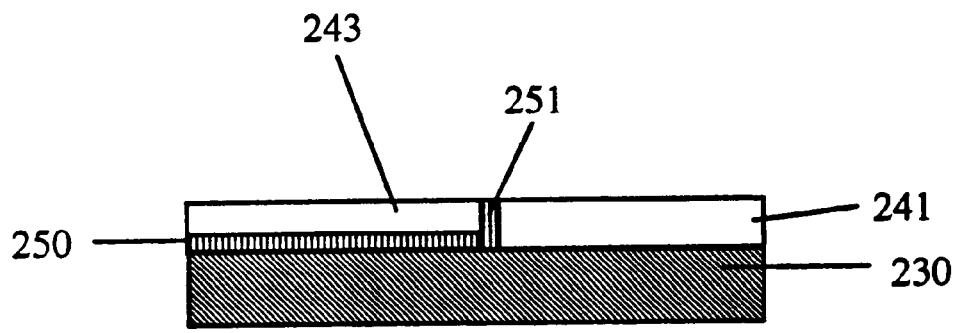
FIG. 2f is a side-view depiction of the spacer material side wall being exposed in accordance with the teachings of the present invention.

The layered structure comprising the substrate 230, the first hard mask 241, the spacer material 250, and the second hard mask layer 242 is then planarized, preferably by a chemical-mechanical polishing process, in order to expose the spacer 251 as shown in FIG. 2f. The planarization process also results in the formation of a second hard mask 243.

Figure 2G:
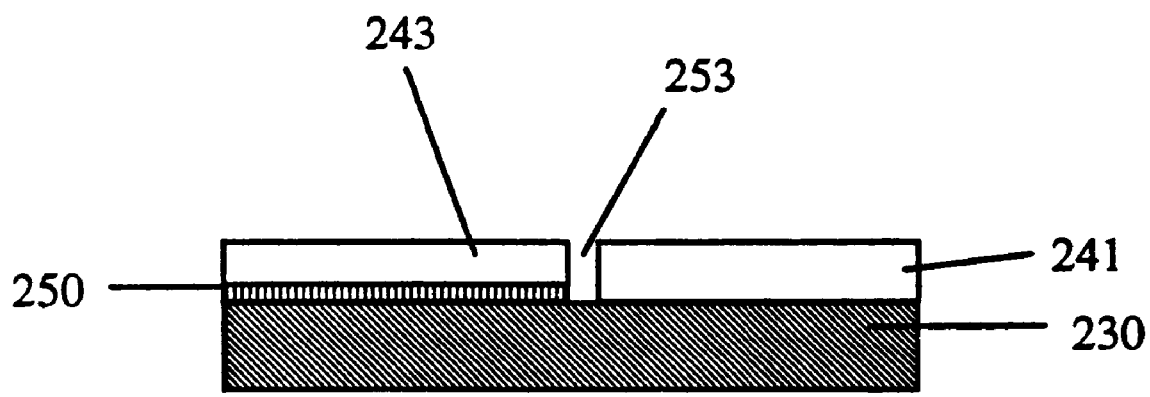
FIG. 2g is a side-view depiction of the spacer having been removed in accordance with the teachings of the present invention.

After the chemical-mechanical polishing process, the exposed spacer 251 is selectively removed with an etchant which can selectively etch the spacer 251 with respect to the first hard mask 241 and the second hard mask 243. The resulting completed narrow space 253 is depicted in FIG. 2g.

Figure 3A:
FIG. 3a is a side-view depiction of a substrate and a layer of first mask material implemented in accordance with the teachings of the present invention.

FIGS. 3a–3h depict an alternative method of forming a narrow space in accordance with the teachings of the present invention. The steps shown in FIGS. 3a–3d are the same as those discussed above in connection with FIGS. 2a–2d. FIG. 3a shows a side view of a layer of first mask material 340 formed on a substrate 330. The preferred first mask material in this example is silicon dioxide, formed by blanket deposited to a thickness of preferably 1800 angstroms (Å), although other thicknesses are possible. Materials other than silicon dioxide may also be used as the first mask material, including silicon nitride. The mask material can be any material that can withstand high temperature processing and can be etched. The substrate in the present example comprises silicon. Silicon formed on other substrates Such as silicon oxide, aluminum oxide, or glass can also be used.

Figure 3B:
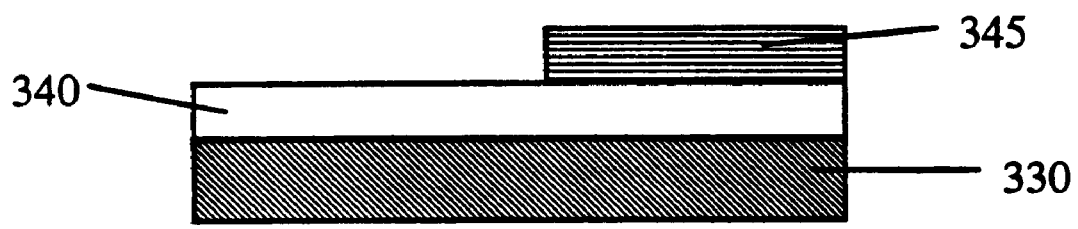
FIG. 3b is a side-view depiction of a photoresist mask formed on the layer of first mask material in accordance with the teachings of the present invention.
Figure 3C:
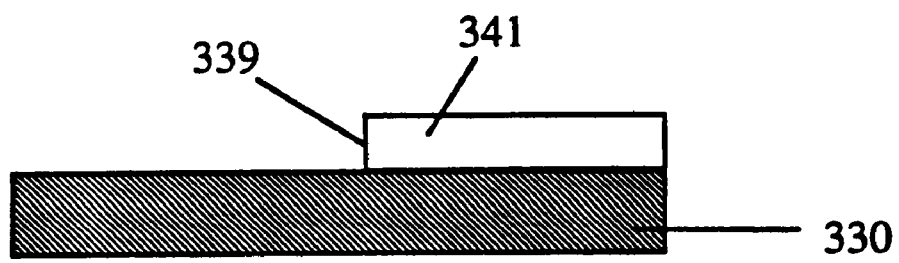
FIG. 3c is a side-view depiction of the first mask material having been patterned to form a first mask in accordance with the teachings of the present invention.

The first mask material 340 is typically patterned using a known photoresist lithography and plasma etching process. FIG. 3b shows a photoresist mask 345. The photoresist mask is used to form a first hard mask 341, as depicted in FIG. 3c. It is adjacent to the edge of the hard mask that the narrow space will be formed, as discussed below. Therefore, it is the patterning of the first hard mask material 340 that will determine the location of the narrow space.

Figure 3D:
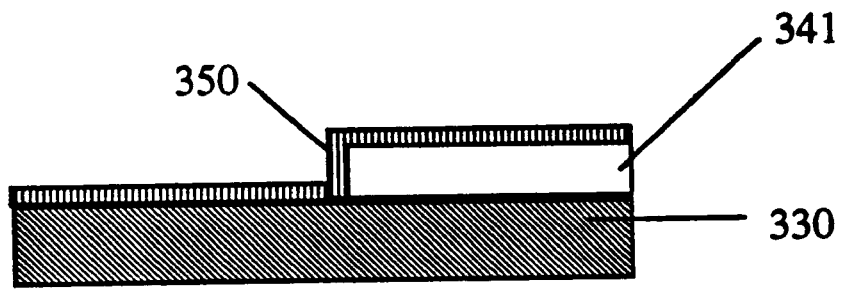
FIG. 3d is a side-view depiction of a layer of spacer material formed over the substrate and first mask in accordance with the teachings of the present invention.

Next, a layer of spacer material 350 is formed, as shown in FIG. 3d. The spacer material 350 is selected to be one that can withstand high temperature processing and can be etched. Further, the spacer material 350 must be one that allows selective etching of the spacer material 350 without also etching the first hard mask 341 or the second hard mask 361, discussed below and shown in FIG. 3g. The preferred spacer material in this example is silicon nitride. The silicon nitride 350 is blanket deposited, preferably using chemical vapor deposition. The silicon nitride is deposited conformally. The vertical portion of spacer material 350 adjacent to the first hard mask 341 edge is referred to as the spacer 351. The thickness of the deposited silicon nitride 350, and thus the spacer 351, will determine the dimension of the future narrow space structure. Preferably, the thickness of the deposited silicon nitride 350 is 1000 Å or more. Smaller thicknesses are also possible.

Figure 3E:
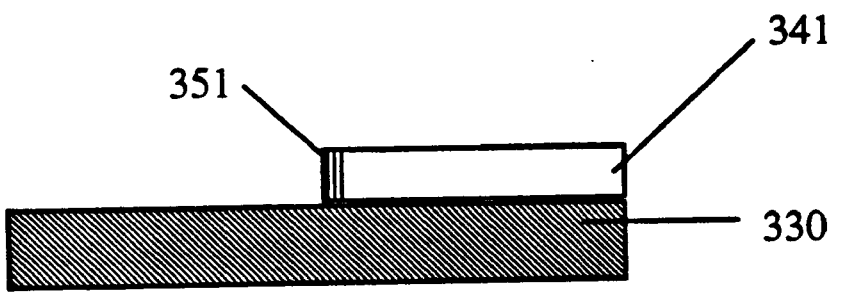
FIG. 3e is a side-view depiction of the layer of spacer material having been anisotropically etched to form a spacer in accordance with the teachings of the present invention.

After the deposition of the spacer material 350, the spacer material 350 is anisotropically etched. The etching is preferably accomplished using a reactive ion etching (RIE) process. By etching anisotropically, the spacer material will be completely removed from the horizontal surfaces, but the spacer 351 will remain intact. This is shown in FIG. 3e.

Figure 3F:
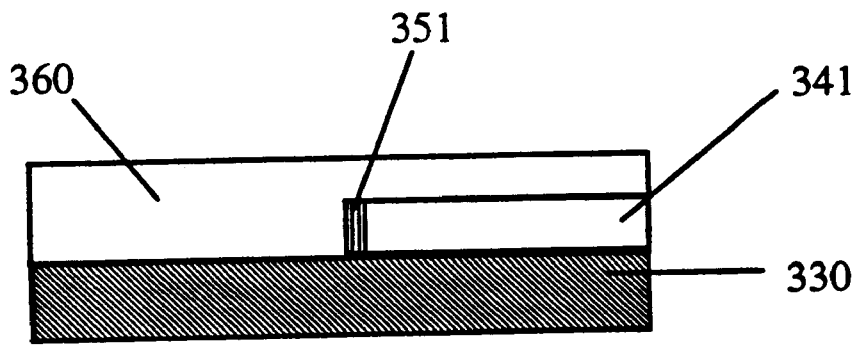
FIG. 3f is a side-view depiction of a layer of second mask material formed over the previously existing structures in accordance with the teachings of the present invention.

Following the etching of the spacer material, a layer of second hard mask material 360 is formed over the existing structures, as depicted in FIG. 3f. The preferred second hard mask material 360 in this example is silicon dioxide, formed by blanket deposition to a thickness of 1800 Å. Other thicknesses are also possible. Other materials can also be used, including silicon nitride. The same considerations for selecting the first hard mask material 340 apply with respect to the second hard mask material 360.

Figure 3G:
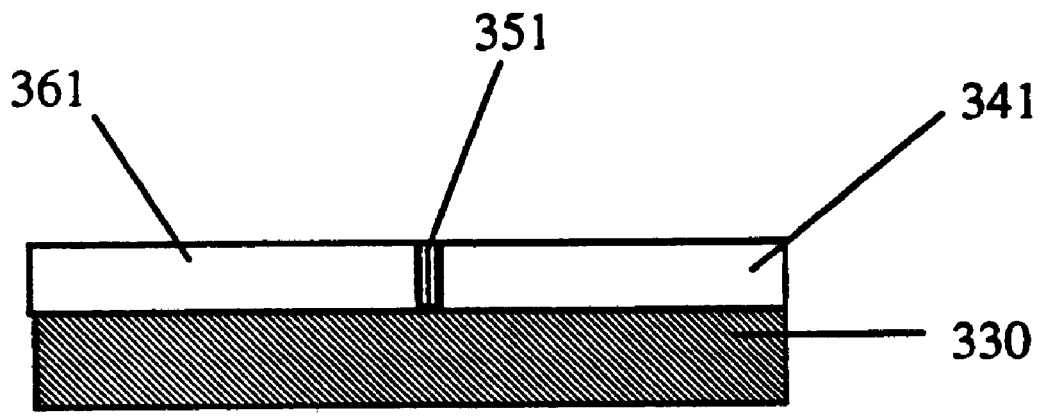
FIG. 3g is a side-view depiction of the spacer being exposed in accordance with the teachings of the present invention.

The layered structure comprising the substrate 330, the first hard mask 341, the spacer 351, and the second hard mask layer 360 is then planarized, preferably by a chemical-mechanical polishing process, in order to expose the spacer 351 as shown in FIG. 3g. The planarization process also results in the formation of a second hard mask 361.

Figure 3H:
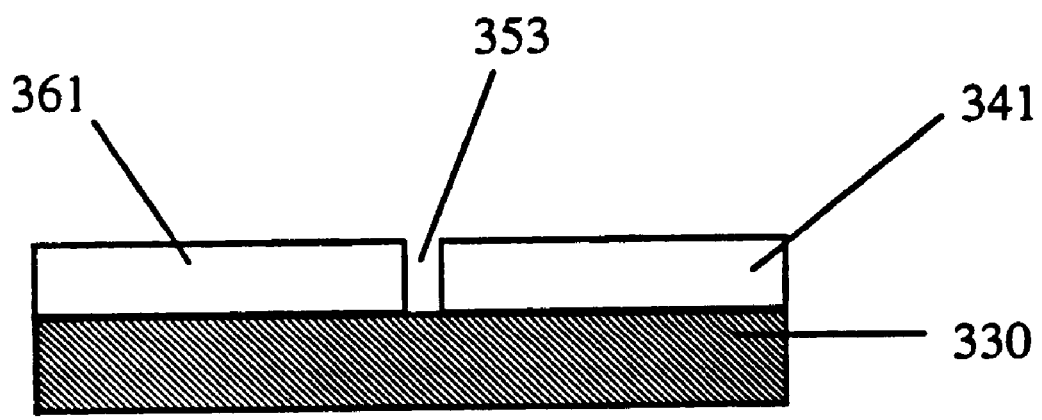
FIG. 3h is a side-view depiction of the spacer having been removed in accordance with the teachings of the present invention.

After the chemical-mechanical polishing process, the exposed spacer 351 is selectively removed. The resulting completed narrow space 353 is depicted in FIG. 3h.

Figure 4A:
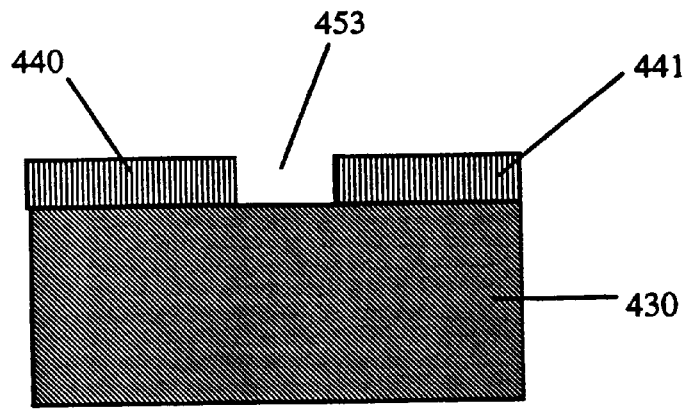
FIG. 4a is a side-view depiction of a substrate and a previously formed narrow spaced defined by nitride masks implemented in accordance with the teachings of the present invention.

The narrow spaces formed using the method of the present invention may be used to create transistor gates. The present invention allows for channel engineering before the formation of the gate. One example of channel engineering which uses channel implantation is depicted in FIGS. 4a–4e. FIG. 4a shows a narrow space 453 formed over a substrate 430. The narrow space is defined by a first hard mask 440 and a second hard mask 441. The narrow space 453 is formed using the process described above in connection with FIGS. 3a–3h. The narrow space 452 can also be formed using the process described above in connection with FIGS. 2a–2g. In this example, the first hard mask 440 and the second hard mask 441 comprise silicon nitride. The substrate comprises silicon. The same options and considerations for selecting materials disclosed above in connection with FIGS. 2a–2g and 3a–3h also apply to this example.

Figure 4B:
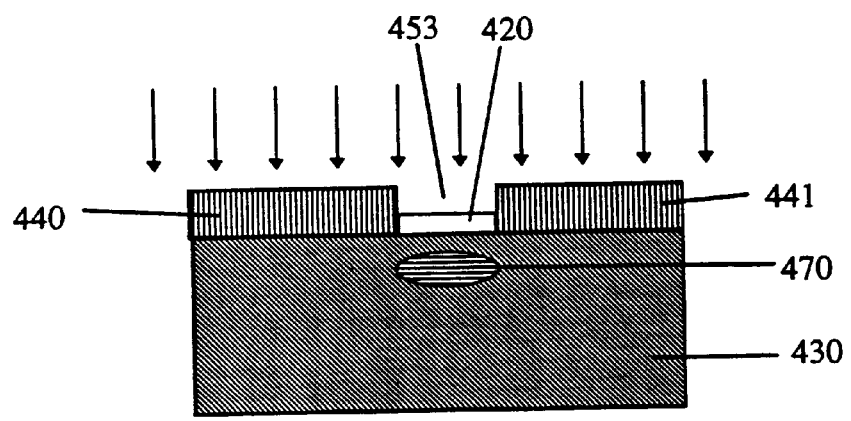
FIG. 4b is a side-view depiction of ion implantation into the channel region in accordance with the teachings of the present invention.

Following the formation of the narrow space 453, a layer of dielectric material 420 is formed on the substrate 430 in the narrow space 453, as shown in FIG. 4b. The dielectric material 420 in this example is silicon dioxide. Other materials are possible. The dielectric material 420 is placed in the narrow space 453 in order to protect the surface of the substrate 430 during implantation. Ion implantation is used to dope the channel region 470 in the substrate 430. The region of the substrate 430 outside the channel region 470 is covered by the first hard mask 440 and the second hard mask 441. The procedure is self-aligned, in that the first hard mask 440 and the second hard mask 441 block the doping ions. This ensures that the channel engineering implant is localized and the junction capacitance need not be traded off for short channel performance. In the present example, for a p-type substrate 430, the channel region 470 is implanted with boron at a dose of approximately $5\times10^{14}$ atoms/cm$^2$ at an energy of approximately 5 keV. Other dopants, doses, and energies are possible.

Figure 4C:
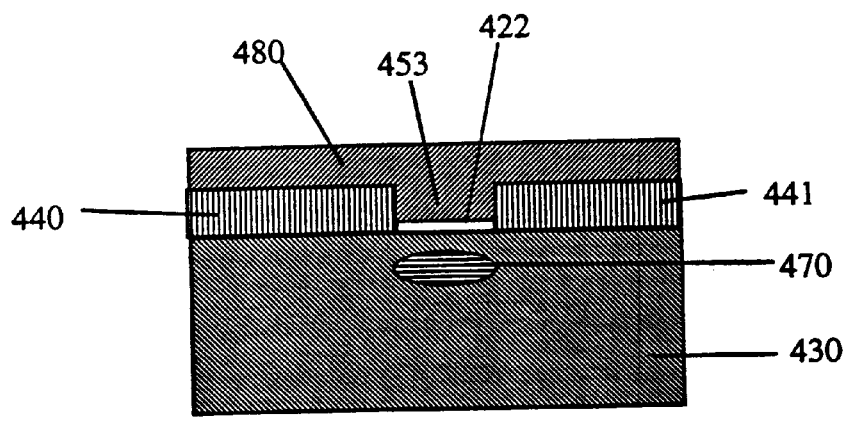
FIG. 4c is a side-view depiction of a gate dielectric formed over the channel region and a layer of polysilicon formed over the existing structures in accordance with the teachings of the present invention.

After the channel implantation, the dielectric material 420 is removed, and a layer of gate dielectric 492 is formed. This is shown in FIG. 4c. The gate dielectric 422 comprises silicon dioxide in the present example. Other possible gate dielectric materials include lead strontium, barium strontium, aluminum oxide, and tantalum pentoxide. A layer of nitrided oxide may also be used. The gate dielectric 422 is preferably deposited to the thickness of between 20–50 Å.

FIG. 4c also discloses that a layer of electrically conductive material 480 is formed over the existing structures. In the present example, the layer of electrically conductive material 480 comprises polysilicon. The layer of polysilicon is preferably formed by a blanket deposition to a thickness of between 2000–3500 Å. Other thicknesses are possible.

Figure 4D:
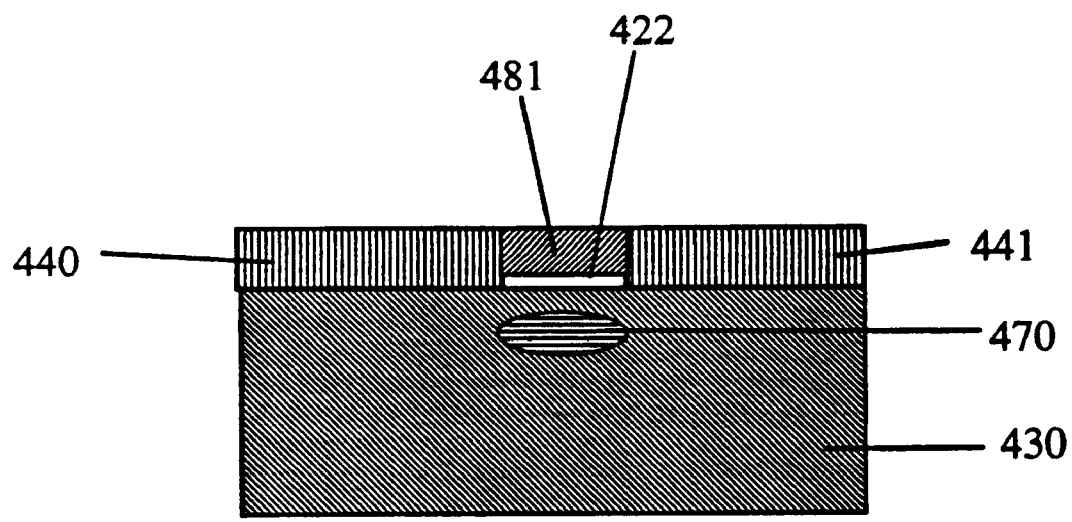
FIG. 4d is a side-view depiction of the polysilicon having been processed by chemical-mechanical polishing in accordance with the teachings of the present invention.

The entire layered structure comprising the substrate 430, the gate dielectric 422, the first hard mask 440, the second hard mask 441, and the polysilicon layer 480 is then sent through a chemical-mechanical polishing process. The polysilicon layer 480 is polished back to the mesas formed by the first hard mask 440 and the second hard mask 441, forming the transistor gate 481. The resulting intermediate structure is shown in FIG. 4d.

Figure 4E:
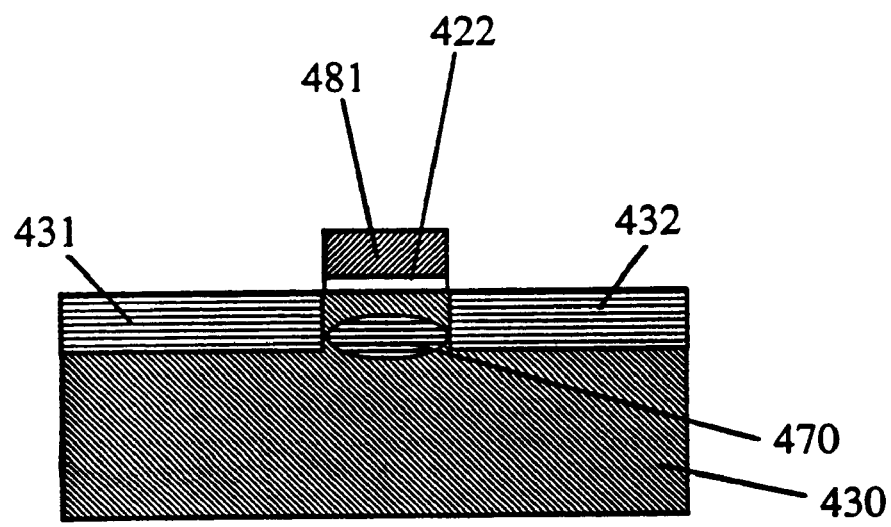
FIG. 4e is a side-view depiction of the transistor gate structure implemented in accordance with the teachings of the present invention.

The first hard mask 440 and the second hard mask 441 are then removed, which completes the formation of the gate structure. Following the formation of the gate, the source 431 and drain 432 regions are formed on opposite sides of the gate structure using methods well known in the art. The completed transistor structure is shown in FIG. 4e.

Figure 5A:
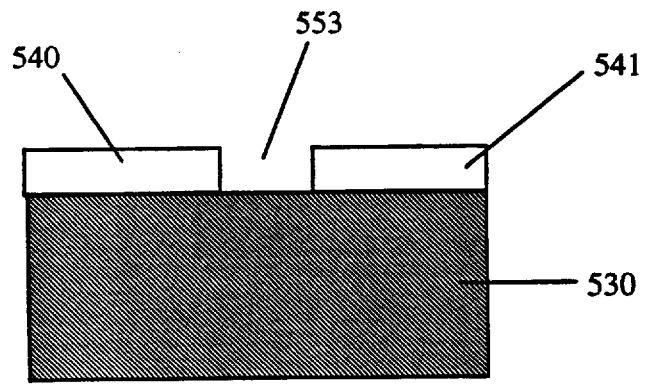
FIG. 5a is a side-view depiction of a substrate and a previously formed narrow space defined by silicon dioxide masks in accordance with the teachings of the present invention.

Another example of channel engineering that is possible using the present invention is channel recess by etching. This is shown in FIGS. 5a–5g. FIG. 5a shows a substrate 530, a first hard mask 540, a second hard mask 541, and a narrow space 553 defined by the first hard mask 540 and the second hard mask 541. For this example, the substrate 530 comprises silicon, and the first hard mask 540 and the second hard mask 541 comprise silicon dioxide. Other materials are also possible. The narrow space is formed using the process described above in connection with FIGS. 3a–3h. The narrow space can also be formed using the process described above in connection with FIGS. 2a–2g.

Figure 5B:
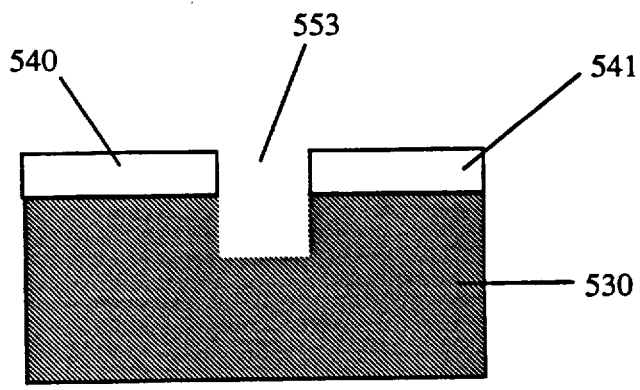
FIG. 5b is a side-view depiction of the channel area having been recessed by etching in accordance with the teachings of the present invention.

Following the formation of the narrow space 553, the substrate 530 is etched in the region not covered by the first hard mask 540 or the second hard mask 541 in order to form a channel recess, as depicted in FIG. 5b. The substrate is etched to a depth of approximately 5000 Å, although other depths are possible. The channel recess may also be accomplished by LOCOS.

Figure 5C:
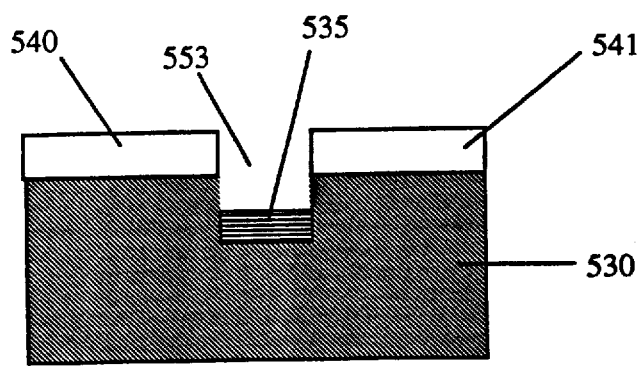
FIG. 5c is a side-view depiction of a layer of silicon formed by epitaxy in the recessed channel region in accordance with the teachings of the present invention.
Figure 5D:
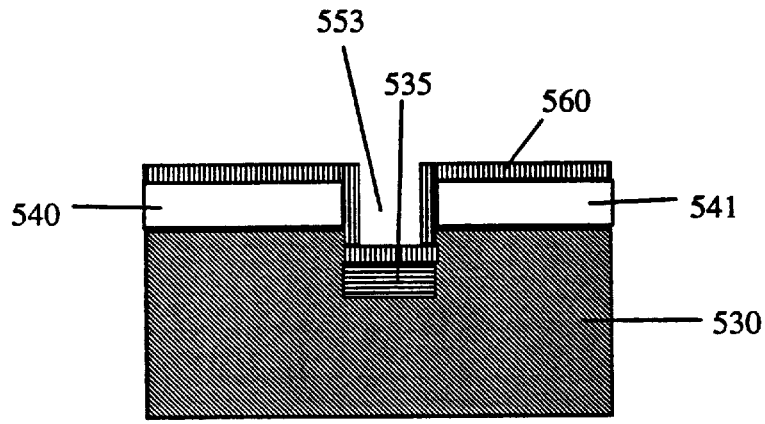
FIG. 5d is a side-view depiction of a layer of nitride conformally deposited over the existing structures in accordance with the teachings of the present invention.

FIG. 5c discloses that a layer of silicon 535 is grown by selective epitaxy in the recess region. The thickness of the silicon grown by epitaxy 535 is preferably approximately 3000 Å. The new layer of silicon is desirable since the etching process discussed above in connection with FIG. 5b causes damage to the surface of the substrate. The new silicon 535 is growing in order to create a more perfect channel region where electrons are more able to flow freely. The new silicon 535 may also be doped in order to increase channel conductivity.

Next, a layer of insulating material 560 is formed over the existing structures. The insulating material in this example comprises silicon nitride, although other materials are possible. The silicon nitride 560 is blanket deposited, preferably using chemical vapor deposition. Preferably, the thickness of the deposited silicon nitride 560 is approximately 200 Å. Other thicknesses are possible.

Figure 5E:
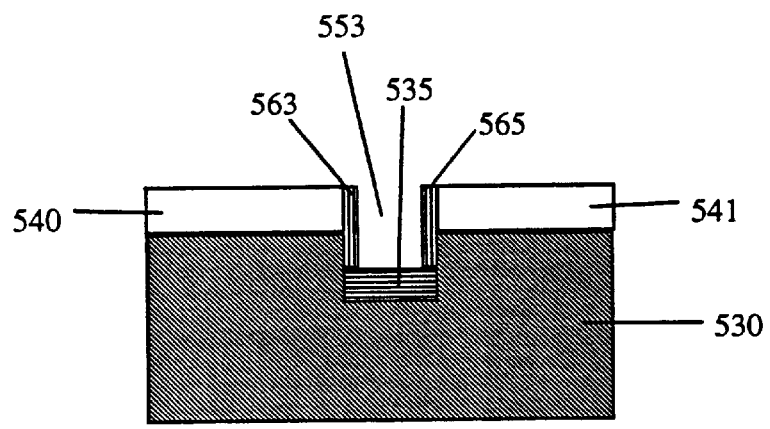
FIG. 5e is a side-view depiction of the layer of nitride having been anisotropically etched in accordance with the teachings of the present invention.

Following the deposition of the silicon nitride 560, the silicon nitride is anisotropically etched, as shown in FIG. 5e. This forms two insulating spacers 563 and 565. The insulating spacers 563 and 565 prevent the future gate structure from shorting against the future source and drain structures. The etching of the silicon nitride is accomplished using an RIE process.

Figure 5F:
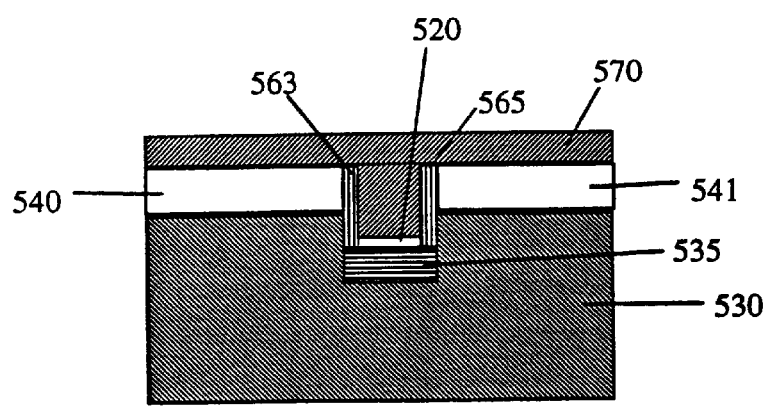
FIG. 5f is a side-view depiction of a gate dielectric formed over the channel region and a layer of polysilicon formed over the existing structures in accordance with the teachings of the present invention.

After the insulating spacers 563 and 565 are formed, a layer of gate dielectric 520 is formed. This is shown in FIG. 5f. The gate dielectric 520 comprises thermally grown silicon dioxide in the present example. Other possible gate dielectric materials include lead strontium, barium strontium, aluminum oxide, and tantalum pentoxide. A layer of nitrided oxide may also be used. The gate dielectric 520 is preferably deposited to the thickness of between 20–50 Å.

FIG. 5f also discloses that a layer of electrically conductive material 570 is formed over the existing structures. In the present example, the layer of electrically conductive material 570 comprises polysilicon. The layer of polysilicon is preferably formed by a blanket deposition to a thickness of approximately 3000 Å. Other thicknesses are possible.

Figure 5G:
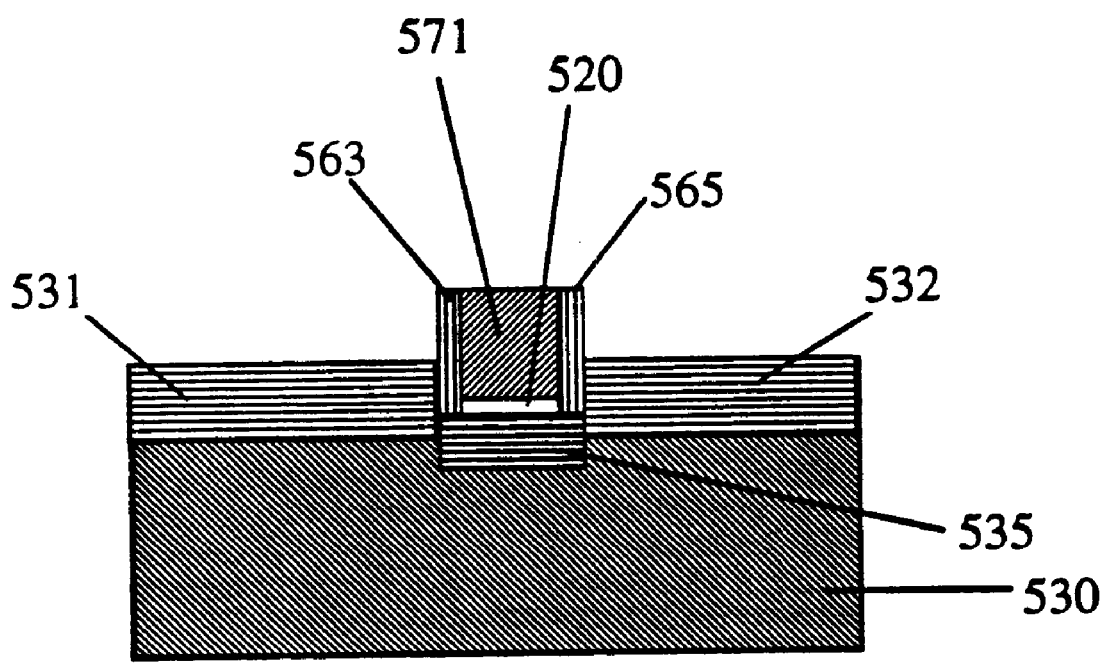
FIG. 5g is a side-view depiction of the transistor gate structure implemented in accordance with the teachings of the present invention.

The entire layered structure comprising the substrate 530, the silicon grown by epitaxy 535, the gate dielectric 520, the insulating spacers 563 and 565, the first hard mask 540, the second hard mask 541, and the polysilicon layer 570 is then sent through a chemical-mechanical polishing process. The polysilicon layer 570 is polished back to the mesas formed by the first hard mask 540 and the second hard mask 541, forming the transistor gate 471. The first hard mask 540 and the second hard mask 541 are then removed. The completed gate structure is shown in FIG. 5g.

Following the formation of the gate, the remaining transistor structures are formed using methods well known in the art.

Figure 6:
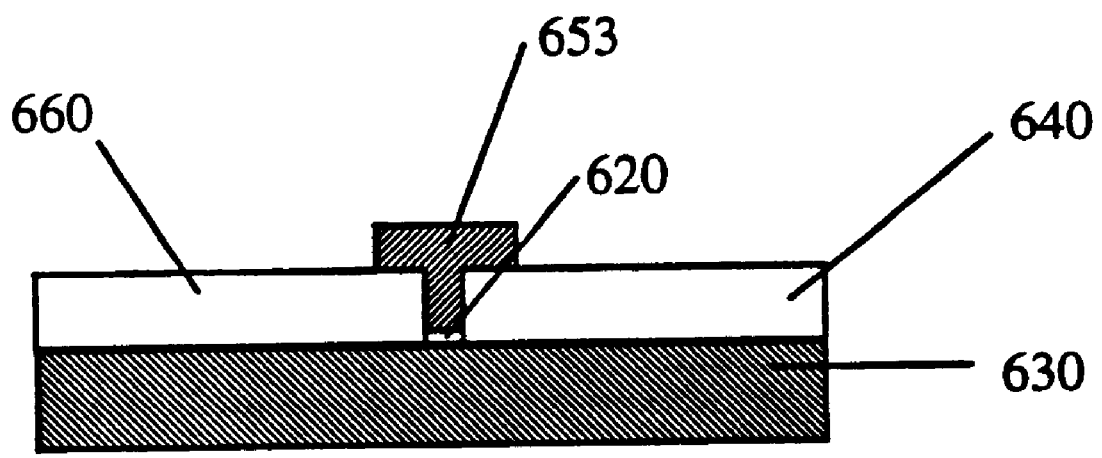
FIG. 6 is a side-view depiction of a T-gate structure implemented in accordance with the teachings of the present invention.

The present invention may also be used to create a T-gate structure 653, depicted in FIG. 6. The advantage of this structure is that gate resistance can be greatly reduced for long polysilicon lines of minimum width. The T-gate 653 is formed by first creating a narrow space using one of the processes mentioned above in connection with FIGS. 2a–2g or FIGS. 3a–3h. Then, a gate dielectric 620 is formed on the substrate in the narrow space defined by the first hard mask 640 and the second hard mask 660. The preferred gate dielectric material in this example is silicon dioxide, but other materials are also possible. After the formation of the gate dielectric 620, a layer of polysilicon is formed over the existing structures. The polysilicon is formed by blanket deposition to a thickness of between 2000–3500 Å. Other thicknesses are possible. Finally, the polysilicon is patterned by conventional photolithography to produce the completed T-gate structure 653.

In the foregoing specification the invention has been described with reference to specific exemplary embodiments thereof. It will, however, be evident that various modifications and changes may be made theieto without departing from the broader spirit and scope of the invention as set forth in the appended claims. The specification and drawings are accordingly to be regarded in an illustrative rather than in a restrictive sense.

What is claimed is:

1. A method of forming an opening using a litho-less process, comprising the steps of:
   forming a first mask on a substrate, the first mask consisting of a first mask material, the first mask having all edge;
   forming a spacer adjacent to the edge, the spacer consisting of a spacer material;
   forming a second mask adjacent to the spacer, the second mask consisting of a second mask material; and
   removing the spacer.

2. The method of forming an opening of claim 1, wherein the step of forming a first mask is accomplished using photolithographic process.

3. The method of forming an opening of claim 1, wherein the spacer material is capable of being selectively etched with respect to the first and second mask materials.

4. A method of forming an opening using a litho-less process, comprising the steps of:
   forming a layer of first mask material over a substrate;
   patterning the layer of first mask material to form a first mask using a photolithographic process, the first mask having an edge;
   forming a spacer adjacent to the edge, the spacer consisting of a spacer material;
   forming a layer of second mask material over the substrate, the spacer, and the first mask;
   plagiarizing the second mask material to reveal the spacer; and
   removing the spacer.

5. The method of forming an opening of claim 4, wherein the spacer material is capable of being selectively etched with respect to the first and second mask materials.

6. The method of forming an opening of claim 5, wherein the spacer material consists of silicon nitride.

7. The method of forming an opening of claim 6, wherein the first and second mask materials consist of silicon dioxide.

8. The method of forming an opening of claim 5, wherein the spacer material consists of silicon dioxide.

9. The method of forming an opening of claim 8, wherein the first and second mask materials consist of silicon nitride.

10. A method of forming an opening using a litho-less process, comprising the steps of:
    forming a layer of first mask material over a substrate;
    patterning the layer of first mask material to form a first mask using a photolithographic process, the first mask having an edge;
    forming a layer of spacer material over the substrate and the first mask;
    etching the spacer material to form a spacer adjacent to the first mask;
    forming a layer of second mask material over the spacer, the substrate, and the first mask;
    plagiarizing the layer of second mask material to reveal the spacer; and
    removing the spacer.

11. The method of forming an opening of claim 10, wherein the first mask material comprises silicon dioxide.

12. The method of forming an opening of claim 10, wherein the first mask material comprises silicon nitride.

13. The method of forming an opening of claim 10, wherein the step of forming a layer of spacer material further comprises the step of performing a conformal pattern transfer layer deposition of the spacer material.

14. The method of forming an opening of claim 13, wherein the step of etching the spacer material is accomplished by using a reactive ion etching process.

15. The method of forming an opening of claim 14, wherein the spacer material comprises silicon nitride.

16. The method of forming an opening of claim 14, wherein the spacer material comprises silicon dioxide.

17. The method of forming an opening of claim 10, wherein the step of patterning the layer of second mask material is accomplished by using a chemical-mechanical polishing process.

18. A method of forming an opening using a litho-less process, comprising the steps of:
    forming a layer of first mask material over a substrate;
    patterning the layer of first mask material to form a first mask using a photolithographic process, the first mask having an edge;
    performing a conformal pattern transfer layer deposition of a spacer material over the substrate and the first mask, the spacer material having a sidewall adjacent to the edge, the sidewall forming a spacer;
    forming a layer of second mask material over the spacer material and the first mask;
    performing a chemical-mechanical polishing process to expose the spacer; and removing the spacer.

19. The method of forming an opening of claim 18, wherein the first mask material comprises silicon dioxide.

20. The method of forming an opening of claim 18, wherein the first mask material comprises silicon nitride.

21. The method of forming an opening of claim 18, wherein the spacer material comprises silicon nitride.

22. The method of forming an opening of claim 18, wherein the spacer material comprises silicon dioxide.

23. A method of forming a transistor gate, comprising the steps of:
    forming a first mask on a substrate, the first mask having an edge;
    forming a spacer adjacent to the edge;
    forming a second mask adjacent to the spacer;
    removing the spacer;
    doping the substrate in the area exposed by removing the spacer;

forming a gate dielectric on the substrate in the area exposed by removing the spacer; and depositing an electrically conductive material on the gate dielectric.

24. A method of forming a transistor gate, comprising the steps of:

forming a first mask on a substrate, the first mask having an edge;

forming a spacer adjacent to the edge;

forming a second mask adjacent to the spacer;

removing the spacer;

recessing the substrate in the area exposed by removing the spacer;

forming a gate dielectric on the substrate in the recessed area; and depositing an electrically conductive material on the gate dielectric.

* * * * *

UNITED STATES PATENT AND TRADEMARK OFFICE
CERTIFICATE OF CORRECTION

PATENT NO. : 5,918,132
DATED : June 29, 1999
INVENTOR(S) : Qian et al.

It is certified that error appears in the above-identified patent and that said Letters Patent is hereby corrected as shown below:

Column 5,
Line 20, delete "call" and insert -- can --.

Column 7,
Line 33, delete "492" and insert -- 422 --.

Column 8,
Line 19, delete "growing" and insert -- grown --.
Line 37, delete "arc" and insert -- are --.

Column 9,
Line 18, delete "theieto" and insert -- thereto --.
Line 51, delete "plagiarizing" and insert -- planarizing --.

Column 10,
Line 12, delete "plagiarizing" and insert -- planarizing --.

Signed and Sealed this

Twenty-ninth Day of April, 2003

JAMES E. ROGAN
*Director of the United States Patent and Trademark Office*